(12) United States Patent
Doyle

(10) Patent No.: US 7,539,467 B1
(45) Date of Patent: May 26, 2009

(54) LOW LEAKAGE IC INPUT STRUCTURES INCLUDING SLAVED STANDBY CURRENT SHUT-OFF AND INCREASED GAIN FOR TIGHTER HYSTERESIS

(75) Inventor: James T. Doyle, Nederland, CO (US)

(73) Assignee: National Semiconductor Corporation, Santa Clara, CA (US)

( * ) Notice: Subject to any disclaimer, the term of this patent is extended or adjusted under 35 U.S.C. 154(b) by 704 days.

(21) Appl. No.: 11/065,426

(22) Filed: Feb. 24, 2005

(51) Int. Cl.
*H01Q 11/12* (2006.01)
*H04B 1/04* (2006.01)

(52) U.S. Cl. .................... 455/127.1; 326/98; 455/343.1
(58) Field of Classification Search .............. 455/127.1, 455/574, 343.1, 343.2; 330/297; 326/98, 326/95, 81
See application file for complete search history.

(56) References Cited

U.S. PATENT DOCUMENTS

| | | | |
|---|---|---|---|
| 6,433,584 B1 * | 8/2002 | Hatae | 326/80 |
| 6,646,511 B2 | 11/2003 | Canyon et al. | |
| 6,701,138 B2 | 3/2004 | Epperson et al. | |
| 6,757,526 B1 | 6/2004 | Sharp et al. | |
| 6,788,141 B2 | 9/2004 | Paul et al. | |
| 6,915,117 B2 * | 7/2005 | Chominski et al. | 455/118 |
| 7,042,245 B2 * | 5/2006 | Hidaka | 326/34 |
| 7,248,080 B1 * | 7/2007 | Doyle | 326/95 |

OTHER PUBLICATIONS

Dae Woon Kang et al., "A Low Power Methodology for Portable Electronics", Department of Electrical and Computer Engineering, Northeastern University.

* cited by examiner

*Primary Examiner*—Edward Urban
*Assistant Examiner*—Christian A Hannon

(57) ABSTRACT

Leakage current at the inputs of an integrated circuit can be reduced by providing a master/slave arrangement wherein a plurality of slave inputs are controlled by an enable input acting as a master. When the enable input is deactivated, the slave inputs break their leakage current paths. An input structure with improved hysteresis can be provided by coupling a follow-on inverter to the output of the input stage, and coupling a hysteresis feedback circuit to the output of the follow-on inverter. The hysteresis feedback circuit is also connected to a node of the input stage other than the output thereof.

20 Claims, 4 Drawing Sheets

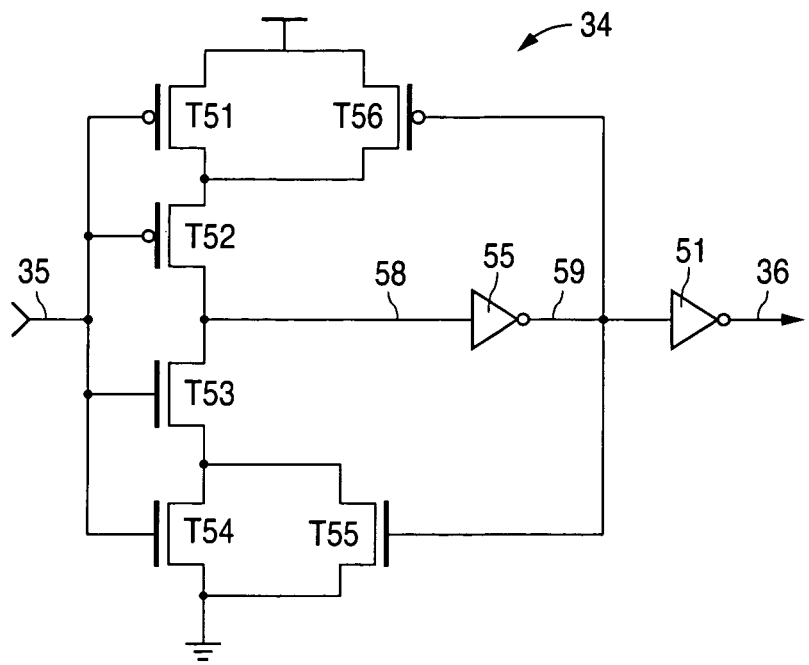
FIG. 5
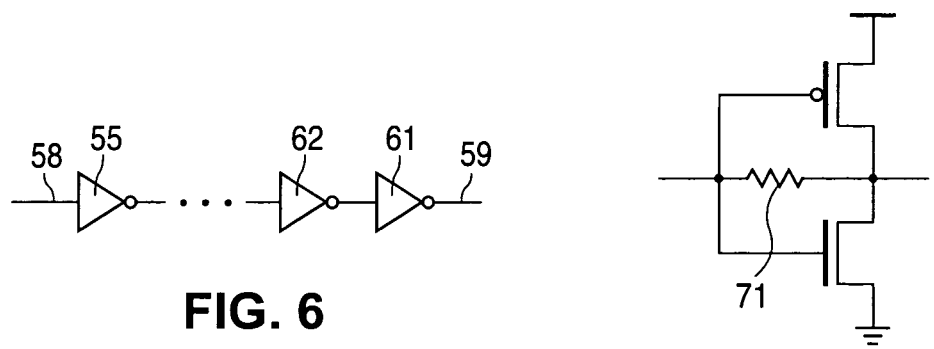
FIG. 6
FIG. 7
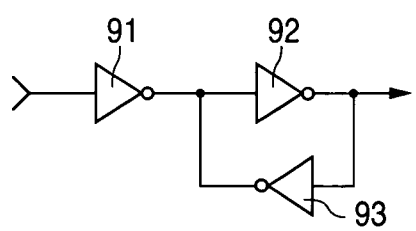
FIG. 9
(PRIOR ART)

US 7,539,467 B1

LOW LEAKAGE IC INPUT STRUCTURES INCLUDING SLAVED STANDBY CURRENT SHUT-OFF AND INCREASED GAIN FOR TIGHTER HYSTERESIS

TECHNICAL FIELD OF THE INVENTION

The invention relates generally to integrated circuits and, more particularly, to reducing leakage currents at the inputs of an integrated circuit (IC).

BACKGROUND OF THE INVENTION

In mobile data processing devices, for example portable and mobile telephones and computers, conservation of battery power is very important. Whenever the data processing circuitry within the device is not being used, it can often be disabled from operation, thereby permitting power savings. However, even with circuitry disabled, there can often remain the problem of leakage currents at the inputs of an integrated circuit device that contains the data processing circuitry. The greater the input leakage current while disabled, the greater the battery power consumption at a time when the device is not even being utilized. Moreover, in some mobile data processing devices, a given integrated circuit might actually be disabled for a large majority of the time that the device is in operation.

For example, some mobile data processing devices support wireless communications. Some wireless communication standards, for example GSM, support a wireless communication protocol known generally as time division multiple access (TDMA). In TDMA applications, the mobile data processing device actively communicates over the wireless communication interface only during predetermined portions of the time that the device is in operation. For example, in GSM, a given mobile device actively communicates via the wireless communication device only during one-eighth of its operating time. During the remaining seven-eighths of the time, a given device is inactive while other devices are using the wireless communication link. Accordingly, a TDMA device can realize significant savings in battery power by simply disabling all circuitry which supports wireless communications during the time that the device is not actively engaged in wireless communication.

FIG. 1 illustrates an example of a mobile device which utilizes a wireless communication interface. In the example of FIG. 1, a CMOS controller IC 12 is powered by a battery 11. The CMOS controller IC 12 controls a power amplifier (PA) 13 which amplifies an input RF signal to produce an output RF signal. An antenna apparatus 14 transmits the RF output signal across a wireless communication interface 15. The CMOS controller IC 12 includes a digital transmit enable input terminal (or input pin) 16, designated TX ENABLE. This transmit enable input is used to enable the CMOS controller IC 12 during the period of time (for example one-eighth of the time) in which the device is actively communicating via the wireless link 15, and to disable the CMOS controller IC 12 during the period of time (for example seven-eighths of the time) in which the device is not actively communicating via the wireless link 15. As shown in FIG. 1, the CMOS controller IC 12 includes other digital input terminals (or pins) designated generally at 17. The digital input terminals illustrated at 16 and 17 receive input signals provided by a baseband processor IC in the mobile device.

If the baseband processor IC has been produced using deep submicron technology, then the input signal levels provided to the CMOS controller IC 12 at 16 and 17 can be as low as 1.2-1.7 volts. The battery 11 typically provides a power voltage in the range of 2.7-5.5 volts. The input pins at 16 and 17 typically drive into circuit structures such as inverters. However, a 1.2-1.7 volt input signal cannot be expected to cleanly switch an inverter circuit which operates from a 2.7-5.5 volt power supply. This means that the input inverters can be expected to exhibit leakage current, regardless of whether the transmit enable pin 16 is activated to enable the CMOS controller IC 12, or is inactivated to disable the CMOS controller IC 12. The current drawn by the controller 12 when inactivated is often referred to as standby current.

One conventional approach to the mismatch between the 1.2-1.7 volt input range and the 2.7-5.5 volt battery range is the use of a regulator to lower the effective supply voltage seen at the input inverters to a level around 1.5 volts. This can permit full on/off states to be achieved without leakage, but the regulator requires a relatively large amount of circuit area, and must also be on at all times, even when the transmit enable pin is deactivated. Thus, much or all of the leakage current that is saved by operation of the regulator must still be drawn to power operation of the regulator anyway.

Moreover, the digital inputs at 17 in FIG. 1 are typically non-deterministic in nature, which means that the digital high/low switching of the signals is not known during the period of time while the transmit enable signal is deactivated. Accordingly, the switching action of these pins while the controller 12 is disabled causes leakage currents during the switching, and these leakage currents are not addressed by the regulator approach described above.

Therefore, there is a need in the art to provide for reduction of leakage currents at IC inputs that receive very low voltage signals, without adversely impacting the overall supply current budget. There is also a need to reduce leakage currents due to non-deterministic input switching that occurs while the IC is disabled.

SUMMARY OF THE INVENTION

To address the above-discussed deficiencies of the prior art, it is a primary object of the present invention to provide a master/slave arrangement wherein a plurality of slave inputs are controlled by an enable input acting as a master. When the enable input is deactivated, the slave inputs break their leakage current paths.

Some embodiments provide an input structure with improved hysteresis by coupling a follow-on inverter to the output of the input stage, and coupling a feedback circuit to the output of the follow-on inverter. The feedback circuit is also connected to a node of the input stage other than the output thereof.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation. A controller may be implemented in hardware, firmware or software, or some combination of at least two of the same. It should be noted that the functionality associated with a controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts:

FIG. 5 diagrammatically illustrates exemplary embodiments of the hysteresis feedback circuit of FIGS. 3 and 4 according to the invention;

FIG. 6 diagrammatically illustrates further exemplary embodiments of the hysteresis feedback circuit of FIG. 5;

FIG. 7 diagrammatically illustrates further exemplary embodiments of the hysteresis feedback circuit of FIG. 5; and FIGS. 8 and 9 illustrate prior art examples of hysteresis feedback circuits.

DETAILED DESCRIPTION OF THE INVENTION

FIGS. 1 through 9, discussed herein, and the various embodiments used to describe the principles of the present invention in this patent document are by way of illustration only and should not be construed in any way to limit the scope of the invention. Those skilled in the art will understand that the principles of the present invention may be implemented in any suitably arranged processing system.

Figure 1:
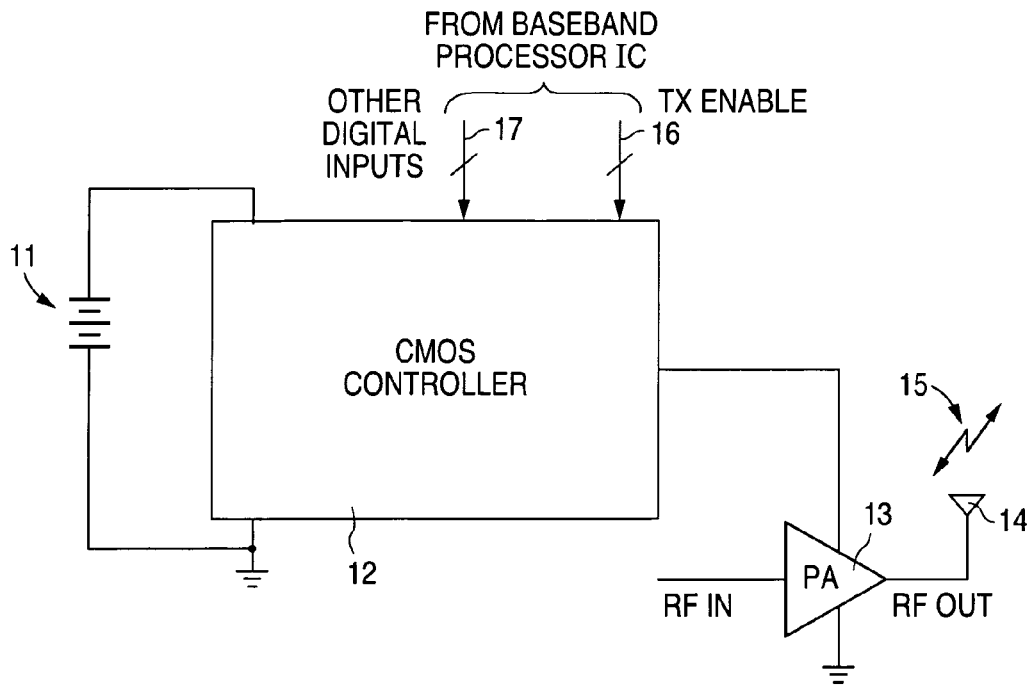
FIG. 1 diagrammatically illustrates a mobile data processing device according to the prior art.
Figure 2:
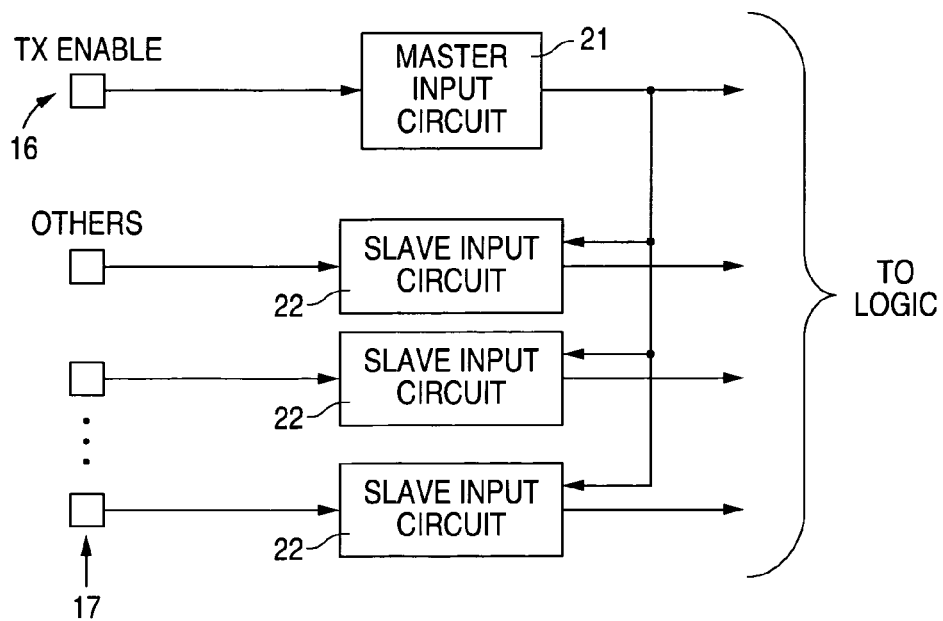
FIG. 2 diagrammatically illustrates a master/slave arrangement of input circuit structures according to exemplary embodiments of the invention.

FIG. 2 diagrammatically illustrates an IC including a master/slave input circuit structure arrangement according to exemplary embodiments of the invention. The transmit enable input terminal 16 is coupled to a master input control circuit 21, and the other input terminals illustrated generally at 17 are coupled to respective slave input circuits 22. The input terminals (or pins) illustrated at 16 and 17 are physically accessible externally of the integrated circuit, and the outputs of the circuits 21 and 22 are fed into the functional circuitry (e.g., data processing logic) of the integrated circuit, for example, power amplifier control circuitry such as in the CMOS controller IC 12 of FIG. 1. The output of the master input control circuit 21 is also coupled as an input to each of the slave input circuits 22. The slave input circuits 22 are slaved to the master input control circuit 21. Each slave input circuit 22 has a leakage current path therein, and is capable of shutting off that leakage current path in response to the output of the master input control circuit 21.

Figure 3:
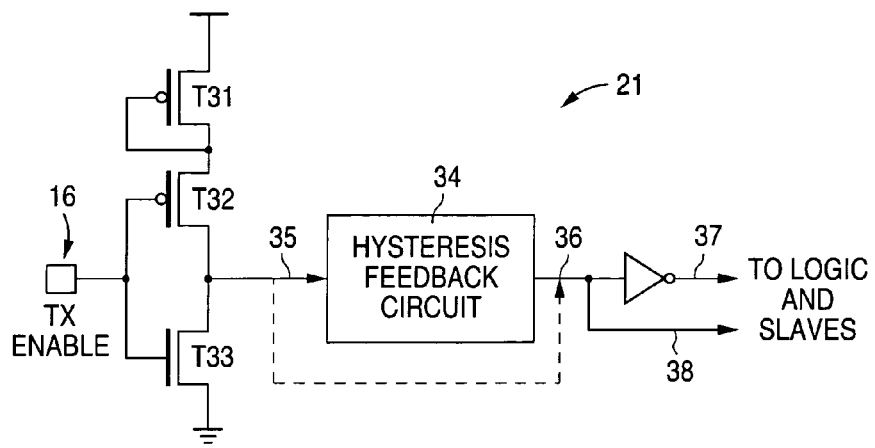
FIG. 3 diagrammatically illustrates exemplary embodiments of the master input circuit of FIG. 2 according to the invention.

FIG. 3 diagrammatically illustrates exemplary embodiments of the master input control circuit 21. The transmit enable input terminal 16 is coupled to the input of an inverter that includes P-channel transistor T32 and an N-channel transistor T33. This inverter, together with P-channel transistor T31, constitutes a level shifted input stage. In some embodiments, the inverter drives the input 35 of a hysteresis feedback circuit 34. Other embodiments omit the circuit 34, as shown by broken line. The output 36 of the hysteresis feedback circuit 34 is provided to the functional logic and slave input circuits at 38, and an inverted version 37 is also provided to the functional logic and slave input circuits. The hysteresis feedback circuit 34 can improve the performance of the enable input terminal 16, as described in more detail below with respect to FIGS. 5-7.

Figure 4:
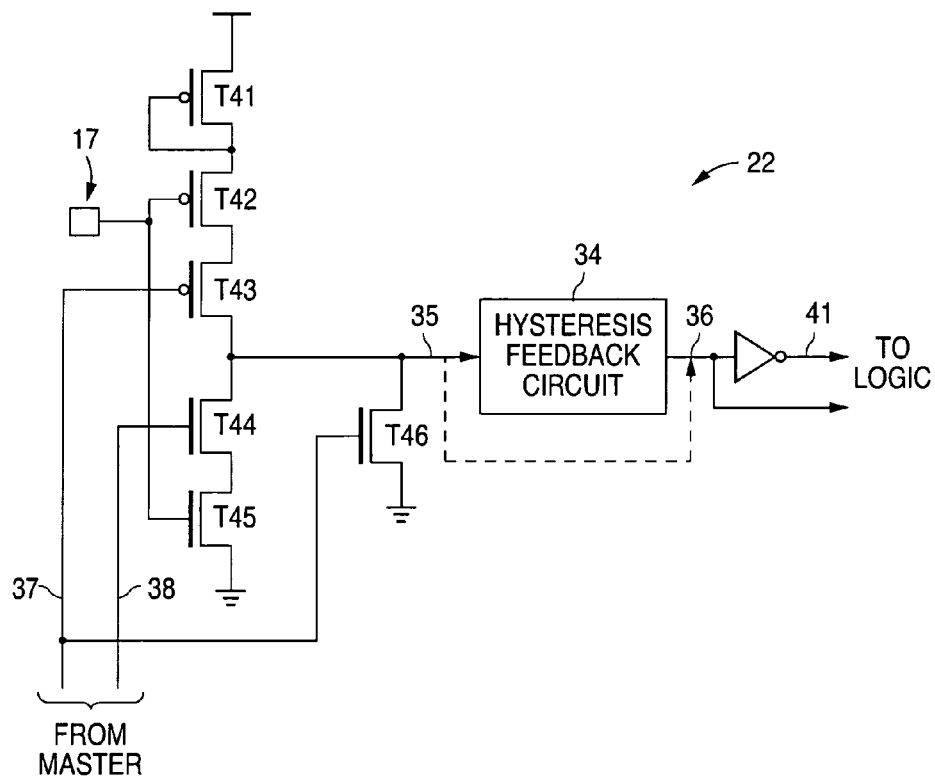
FIG. 4 diagrammatically illustrates exemplary embodiments of the slave input circuits of FIG. 2 according to the invention.

FIG. 4 diagrammatically illustrates exemplary embodiments of the slave input circuits 22 of FIG. 2. The slave input circuit of FIG. 4 includes 5 transistors T41-T46 which form an input stage. The series-connected transistors T42-T45 basically represent an inverter whose leakage current path can be selectively shut off. In particular, the P-channel transistor T42 and the N-channel transistor T45 provide the basic inverter functionality, while the P-channel transistor T43 and the N-channel transistor T44, connected in series between transistors T42 and T45, provide the functionality for shutting off the inverter leakage current path.

The transistors T43 and T44 are controlled by the respective logic signals 37 and 38 produced by the master input control circuit 21. When the transmit enable signal is activated at 16 (see also FIGS. 2 and 3), logic signal 37 is low and logic signal 38 is high. This turns on both T43 and T44, so the input terminal at 17 in FIG. 4 sees the transistors at T42 and T45 connected to form an inverter. The low logic signal at 37 shuts off transistor T46, so the output of the inverter formed by T42 and T45 can, in some embodiments, directly drive the input 35 of the hysteresis feedback circuit 34. Other embodiments omit the circuit 34 as shown by broken line. The logic signal at the output 36 of the hysteresis feedback circuit 34 is provided to the functional logic, together with an inverted version thereof at 41.

When the transmit enable signal is deactivated at 16 (see also FIGS. 2 and 3), the logic signal 37 is high and the logic signal 38 is low, thereby shutting off transistors T43 and T44. This breaks the leakage current path that exists when transistors T42 and T45 are connected (via T43 and T44) to form an inverter. Also when the transmit enable signal is deactivated, the high level of logic signal 37 turns on the transistor T46, which grounds the input 35 of the hysteresis feedback circuit 34.

As demonstrated by the foregoing description of FIGS. 2-4, the master/slave control arrangement causes all leakage current paths associated with the slaved inputs 17 to be shut off whenever the transmit enable (master) input is deactivated to disable the operation of the integrated circuit.

FIG. 5 diagrammatically illustrates exemplary embodiments of the hysteresis feedback circuit 34 according to the invention. The hysteresis feedback circuit 34 includes an input inverter stack formed by P-channel transistors T51 and T52, and N-channel transistors T53 and T54. The output 58 of this inverter stack is input to a follow-on inverter 55 whose output 59 is fed back to control the gates of N-channel transistor T55 and P-channel transistor T56. The P-channel transistor T56 is connected in parallel with the P-channel transistor T51 at the top of the input inverter stack, and the N-channel transistor T55 is connected in parallel with the N-channel transistor T54 at the bottom of the inverter stack. The output 59 of the inverter 55 is also input to a further inverter 51, which provides the output 36 of the hysteresis feedback circuit 34.

Figure 8:
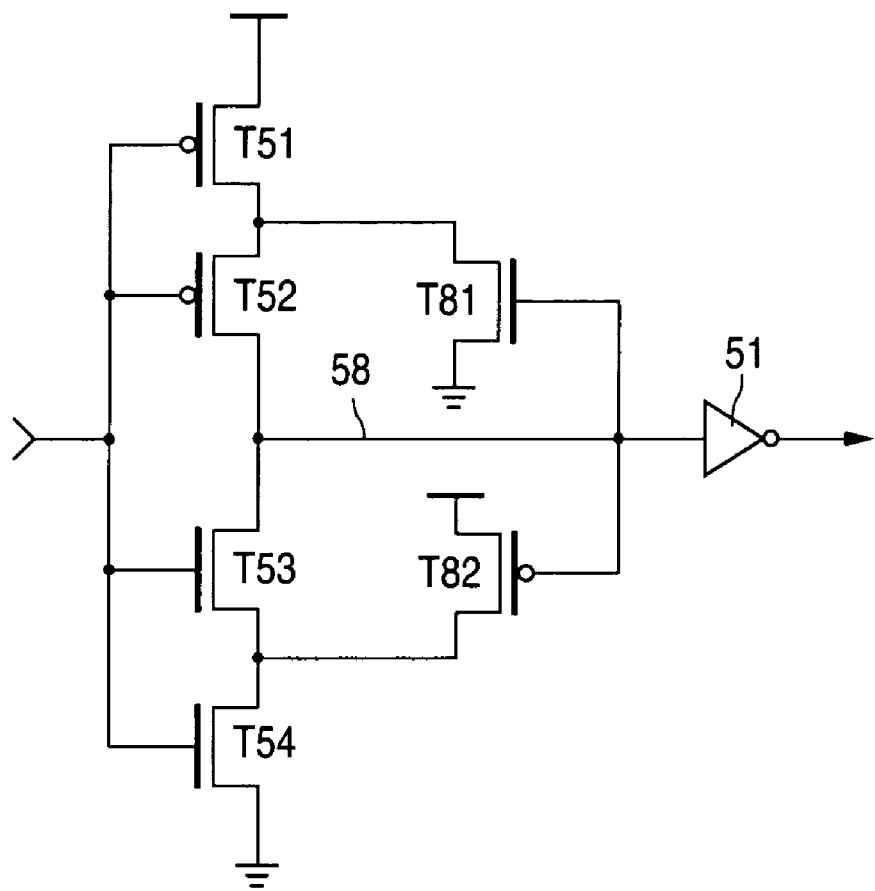

The use of the output 59 of the follow-on inverter 55 to control the feedback transistors T56 and T55 provides additional gain, and thus tighter hysteresis. This differs from prior art arrangements such as shown in FIG. 8, where the feedback transistors T81 and T82 are controlled directly by the output 58 of the input inverter stack. Prior art arrangements such as shown in FIG. 9 use a feedback path which originates at the output of a follow-on inverter 92 that is driven by an input stage inverter 91. The feedback path includes a further inverter 93 whose output is connected to the output of the input stage inverter 91.

FIG. 6 diagrammatically illustrates exemplary alternative embodiments of the hysteresis feedback circuit 34 of FIG. 5. FIG. 6 illustrates that additional gain, and thereby even tighter hysteresis and higher performance, can be obtained by adding one or more pairs of follow-on inverters, such as the pair illustrated at 61 and 62 in FIG. 6. The more follow-on inverters the better the gain and hysteresis.

FIG. 7 illustrates that, in some embodiments, a suitable resistance 71 can be provided to bias the follow-on inverters (such as inverters 55, 62 and 61 of FIG. 6) in order to eliminate offset issues.

Some exemplary input structure embodiments as shown in FIGS. 2-7 can provide input trip points of 0.5 volts for an input low voltage and 1.2 volts for an input high voltage. Some embodiments can provide a fast turn on and turn off, with delays less than 100 picoseconds. Some embodiments can also provide high RF and AC noise immunity, even without external bypass capacitors.

Although the present invention has been described with an exemplary embodiment, various changes and modifications may be suggested to one skilled in the art. It is intended that the present invention encompass such changes and modifications as fall within the scope of the appended claims.

What is claimed is:

1. An integrated circuit, comprising:
   first and second power supply nodes;
   an enable input terminal that is physically accessible externally of the integrated circuit;
   a plurality of further input terminals that are physically accessible externally of the integrated circuit;
   a plurality of input circuits respectively coupled to said plurality of further input terminals, each of said input circuits coupled to said enable input terminal and said first and second power supply nodes, each of said input circuits including a current path from said first power supply node to said second power supply node;
   functional circuitry that can perform a desired operation, said functional circuitry coupled to said input circuits and to said enable input terminal;
   said enable input terminal receiving an enable signal which is activated when said functional circuitry is to be enabled to perform said desired operation and which is deactivated when said functional circuitry is to be disabled from performing said desired operation; and
   each of said input circuits breaking said current path thereof in response to deactivation of said enable signal, wherein each said input circuit includes first and second transistors, and third and fourth series-connected transistors, said third and fourth series-connected transistors connected in series between said first and second transistors.

2. The integrated circuit of claim 1, wherein at least one transistor is a P-channel transistor.

3. The integrated circuit of claim 2, wherein each of said third and fourth transistors has a control input coupled to said enable input terminal, and wherein said first transistor is coupled to one of said first and second power supply nodes and said second transistor is coupled to the other of said first and second power supply nodes.

4. The integrated circuit of claim 3, including a control circuit coupled to said enable input terminal and producing first and second logically complementary digital control signals in response to said enable signal, said control inputs of said third and fourth transistors coupled to said control circuit for receiving said first and second control signals, respectively.

5. The integrated circuit of claim 4, wherein each of said input circuits includes a fifth transistor coupled to a common node defined by said series connection of said third and fourth transistors, said fifth transistor having a control input coupled to said control circuit for receiving one of said first and second control signals.

6. The integrated circuit of claim 5, wherein said fifth transistor is coupled between said common node and one of said first and second power supply nodes.

7. The integrated circuit of claim 2, wherein said first and third transistors are P-channel transistors, and said second and fourth transistors are N-channel transistors.

8. The apparatus of claim 1, wherein at least one transistor is a N-channel transistor.

9. The apparatus of claim 1, wherein the integrated circuit is in a portable telephone.

10. The apparatus of claim 1, wherein at least two transistors are P-channel transistors.

11. The apparatus of claim 1, wherein the integrated circuit is in a computer.

12. A mobile data processing apparatus, comprising:
    a first integrated circuit, including first and second power supply nodes, an enable input terminal that is physically accessible externally of the integrated circuit, a plurality of further input terminals that are physically accessible externally of the integrated circuit, a plurality of input circuits respectively coupled to said plurality of further input terminals, each of said input circuits coupled to said enable input terminal and said first and second power supply nodes, each of said input circuits including a current path from said first power supply node to said second power supply node, and said first integrated circuit including functional circuitry that can perform a desired operation, said functional circuitry coupled to said input circuits and to said enable input terminal;
    a second integrated circuit having a plurality of outputs respectively coupled to said input terminals of said first integrated circuit;
    said enable input terminal receiving from said second integrated circuit an enable signal which is activated when said functional circuitry is to be enabled to perform said desired operation and which is deactivated when said functional circuitry is to be disabled from performing said desired operation; and
    each of said input circuits breaking said current path thereof in response to deactivation of said enable signal, wherein each said input circuit includes first and second transistors, and third and fourth series-connected transistors, said third and fourth series-connected transistors connected in series between said first and second transistors.

13. The apparatus of claim 12, provided as one of a portable computer and a portable telephone.

14. The apparatus of claim 12, including a power amplifier coupled to said first integrated circuit for, under control of said functional circuitry of said first integrated circuit, amplifying a communication signal for transmission across a wireless communication interface.

15. The apparatus of claim 14, wherein said communication signal is a time division multiple access signal.

16. The apparatus of claim 12, wherein at least one transistor is a P-channel transistor.

17. The apparatus of claim 16, wherein each of said third and fourth transistors has a control input coupled to said enable input terminal, and wherein said first transistor is coupled to one of said first and second power supply nodes and said second transistor is coupled to the other of said first and second power supply nodes.

18. The apparatus of claim 17, including a control circuit coupled to said enable input terminal and producing first and second logically complementary digital control signals in response to said enable signal, said control inputs of said third and fourth transistors coupled to said control circuit for receiving said first and second control signals, respectively.

19. The apparatus of claim 12, wherein at least one transistor is a N-channel transistor.

20. The apparatus of claim 12, wherein at least two transistors are P-channel transistors.

\* \* \* \* \*